(12) United States Patent
Fukuda et al.

(10) Patent No.: US 8,501,039 B2
(45) Date of Patent: Aug. 6, 2013

(54) FLUORESCENT MATERIAL AND LIGHT-EMITTING DEVICE EMPLOYING THE SAME

(75) Inventors: Yumi Fukuda, Tokyo (JP); Aoi Okada, Tokyo (JP); Naotoshi Matsuda, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/869,279

(22) Filed: Aug. 26, 2010

(65) Prior Publication Data

US 2011/0204769 A1    Aug. 25, 2011

(30) Foreign Application Priority Data

Feb. 19, 2010    (JP) .................................. 2010-34907

(51) Int. Cl.
*C09K 11/08*    (2006.01)
*C09K 11/66*    (2006.01)

(52) U.S. Cl.
USPC .................................................. 252/301.4 F

(58) Field of Classification Search
USPC .............. 423/132, 386, 328.1, 331, 332, 465; 252/301.4 R, 301.4 F, 301.4 H
See application file for complete search history.

(56) References Cited

U.S. PATENT DOCUMENTS

| 2008/0258602 A1 | 10/2008 | Masuda et al. | |
| 2009/0033201 A1* | 2/2009 | Shimooka et al. | 313/483 |
| 2009/0096361 A1 | 4/2009 | Fukuda et al. | |
| 2009/0267485 A1 | 10/2009 | Nagatomi et al. | |
| 2010/0025632 A1* | 2/2010 | Fukuda et al. | 252/301.6 R |
| 2010/0102707 A1 | 4/2010 | Fukuda et al. | |

FOREIGN PATENT DOCUMENTS

| JP | 2005-255895 | 9/2005 |
| JP | 2008-189700 | 8/2008 |
| JP | 2010-31201 A | 2/2010 |
| WO | 2006/093298 | 9/2006 |
| WO | WO 2007/105631 A1 | 9/2007 |
| WO | WO 2009/072043 A1 | 6/2009 |

OTHER PUBLICATIONS

Fukuda et al., Luminescence Properties of Eu2+-Doped Green-Emitting Sr-Sialon Phosphor and its Application to White Light-Emitting Diodes, published online Dec. 26, 2008, Applied Physics Express, vol. 2, pp. 012401-1 to 012401-3.*
U.S. Appl. No. 13/221,042, filed Aug. 30, 2011, Okada, et al.
U.S. Appl. No. 13/214,572, filed Aug. 22, 2011, Mitsuishi, et al.
U.S. Appl. No. 13/214,444, filed Aug. 22, 2011, Mitsuishi, et al.
U.S. Appl. No. 13/214,608, filed Aug. 22, 2011, Mitsuishi, et al.
U.S. Appl. No. 13/214,410, filed Aug. 22, 2011, Mitsuishi, et al.

(Continued)

*Primary Examiner* — Emily Le
*Assistant Examiner* — Lynne Edmondson
(74) *Attorney, Agent, or Firm* — Oblon, Spivak, McClelland, Maier & Neustadt, L.L.P.

(57) ABSTRACT

The embodiment provides a process for production of a green light-emitting oxynitride fluorescent material having $Sr_3Al_3Si_{13}O_2N_{21}$ crystal structure, and also provides the fluorescent material produced by that process. An metal halide is adopted in the process as one of the starting material metal compounds. As the metal halide, a Ca or Na compound as well as a Sr compound can be preferably employed.

14 Claims, 7 Drawing Sheets

OTHER PUBLICATIONS

U.S. Appl. No. 13/214,377, filed Aug. 22, 2011, Mitsuishi, et al.
U.S. Appl. No. 13/034,137, filed Feb. 24, 2011, Mitsuishi, et al.
U.S. Appl. No. 13/033,917, filed Feb. 24, 2011, Mitsuishi, et al.
U.S. Appl. No. 13/033,960, filed Feb. 24, 2011, Mitsuishi, et al.
U.S. Appl. No. 13/033,954, filed Feb. 24, 2011, Mitsuishi, et al.
U.S. Appl. No. 13/034,120, filed Feb. 24, 2011, Mitsuishi, et al.
U.S. Appl. No. 13/036,410, filed Feb. 28, 2011, Matsuda, et al.
U.S. Appl. No. 13/239,578, filed Sep. 22, 2011, Kato, et al.
The Extended European Search Report issued Sep. 26, 2011, in Europe Application No. / Patent No. 10251530.1-1218 / 2361960.
Office Action issued Feb. 4, 2013 in Korean Patent Application No. 10-2011-0005384 with English language translation.
Office Action issued Aug. 10, 2012 in JP Application No. 2010-034907 with English Translation.
Office Action Issued Mar. 7, 2013, in Taiwanese Application No. 99128872 with English Language Translation.
Office Action issued Jan. 24, 2013 in Chinese Patent Application No. 201010299395.1 (with English translation).

* cited by examiner

F I G. 1A
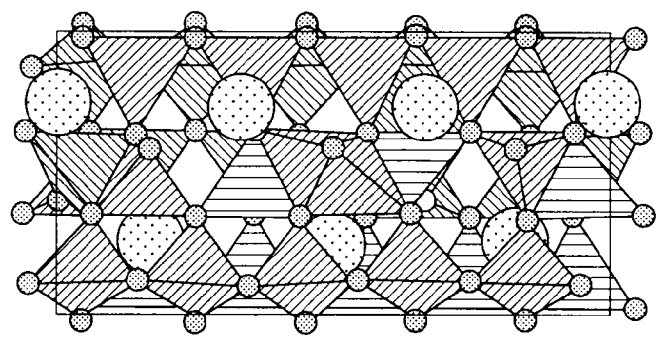
F I G. 1B
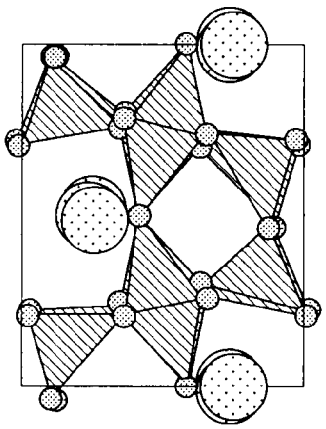
F I G. 1C
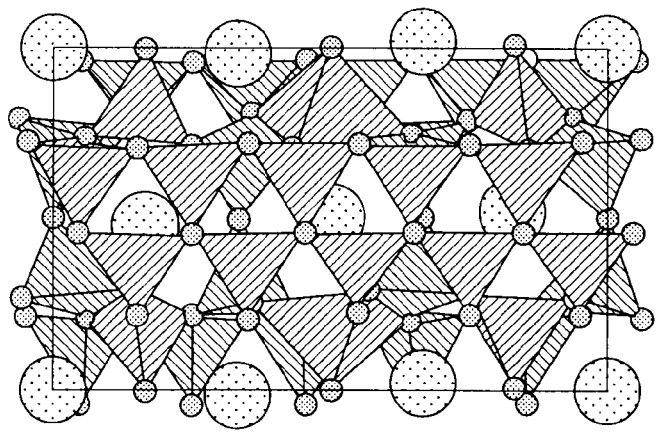

F I G. 2A
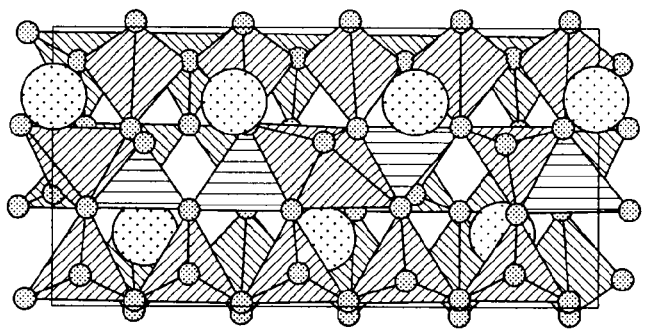
F I G. 2B
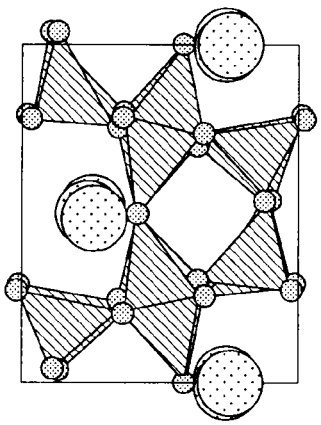
F I G. 2C
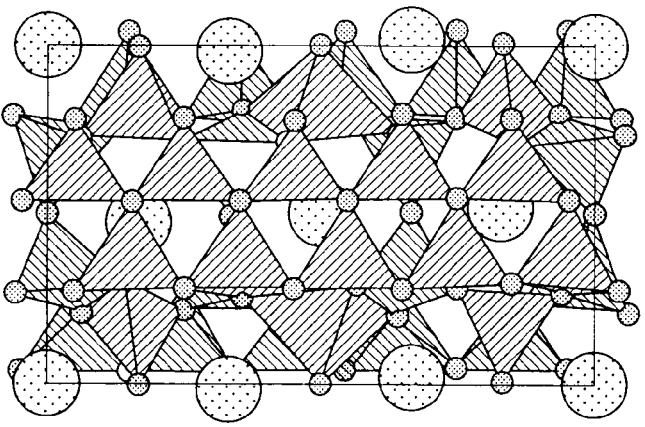

F I G. 4A
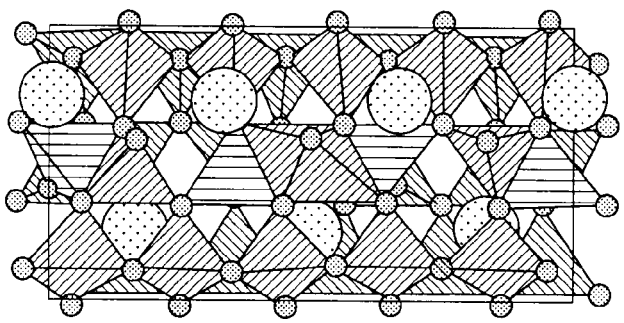
F I G. 4B
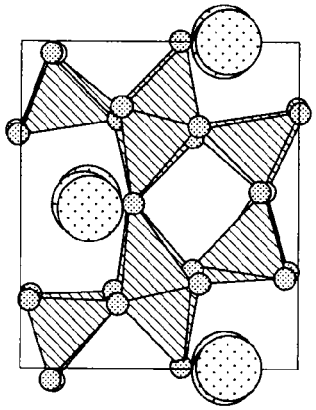
F I G. 4C
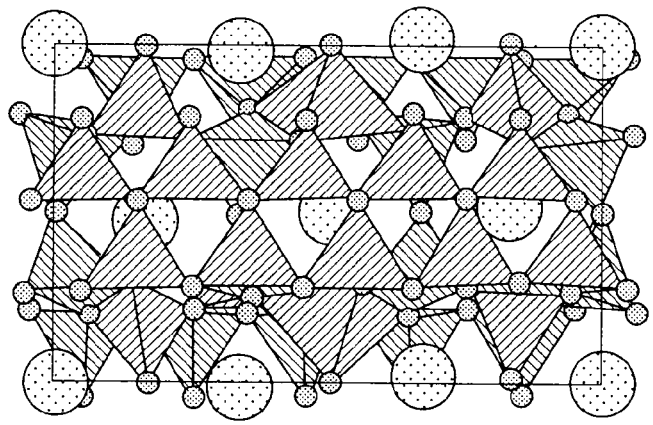

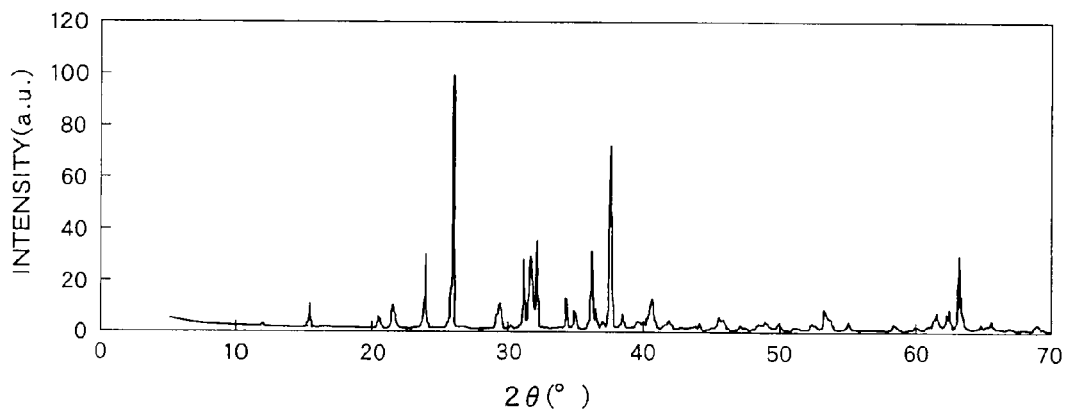
F I G. 8
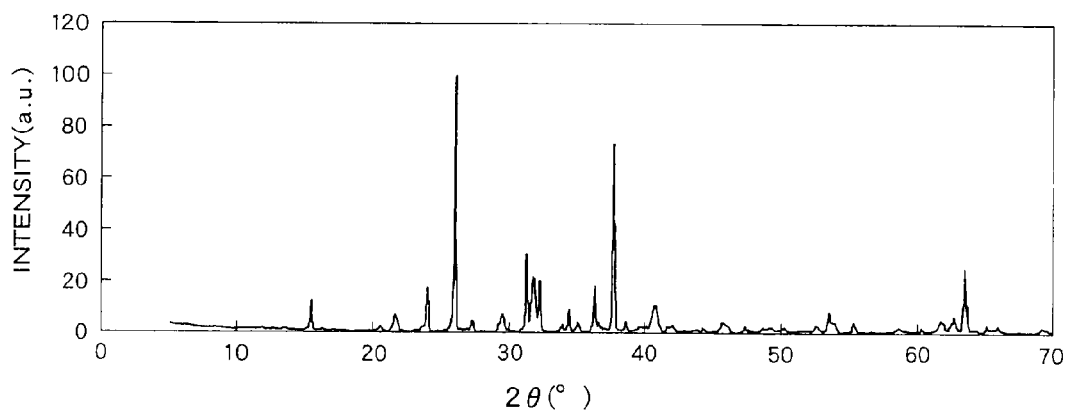
F I G. 9
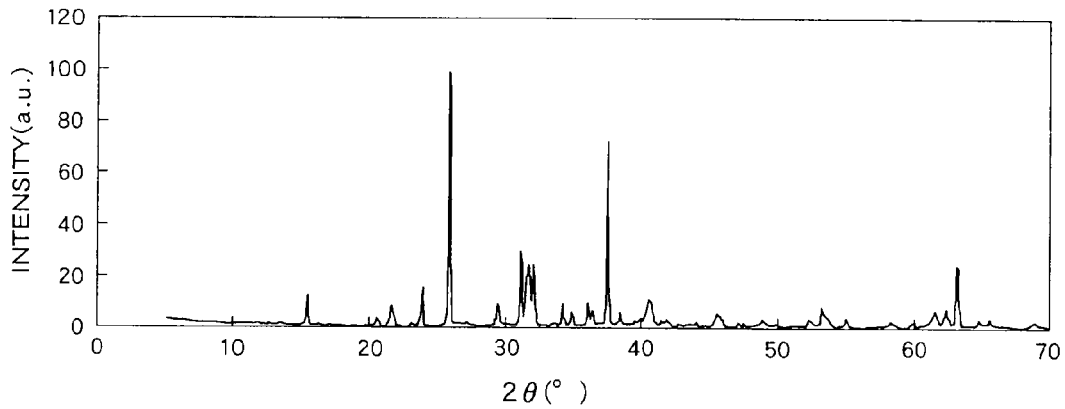
F I G. 10

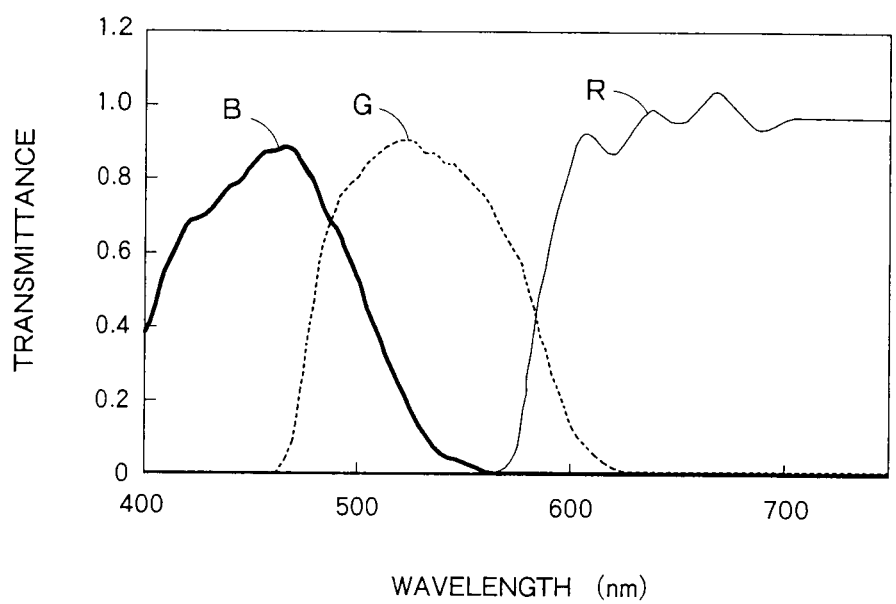
F I G. 11

FLUORESCENT MATERIAL AND LIGHT-EMITTING DEVICE EMPLOYING THE SAME

CROSS-REFERENCE TO RELATED APPLICATIONS

This application is based upon and claims the benefit of priority from the prior Japanese Patent Application No. 2010-34907, filed on Feb. 19, 2010; the entire contents of which are incorporated herein by reference.

FIELD

The embodiment relates to a fluorescent material used in a light-emitting device. Specifically, the embodiment relates to a fluorescent material usable in a display such as a field emission display or in a light-emitting device including a blue or ultraviolet LED as a light source.

BACKGROUND

LED lamps, which utilize light-emitting diodes, are used in many displaying elements of instruments such as mobile devices, PC peripheral equipments, OA equipments, various kinds of switches, light sources for backlighting, and indicating boards. The LED lamps are strongly required not only to have high efficiency, but also to be excellent in color rendition when used for general lighting or to deliver a wide color gamut when used for backlighting. In order to increase the efficiency, it is necessary to adopt a highly efficient fluorescent material. Further, for improving the color rendition and for broadening the color gamut, it is effective to adopt a fluorescent material that emits green luminescence under the excitation with blue light.

On the other hand, high load LEDs generally become so hot while working that fluorescent materials used therein are heated up to a temperature of approx. 100 to 200° C. When the fluorescent materials are thus heated, their emission intensity is generally lowered. Accordingly, it is desired that the emission intensity be less lowered even if the fluorescent materials are heated.

In view of the above, a Eu-activated β-SiAlON phosphor can be regarded as an example of the fluorescent materials which emit green luminescence under the excitation with blue light and hence which are suitably used for the aforementioned LED lamps. That phosphor emits luminescence efficiently when excited at 450 nm, and its absorption ratio, internal quantum efficiency and esternal quantum efficiency under the excitation at 450 nm are approx. 65%, 53% and 35%, respectively.

There are proposed some SiAlON phosphors further improved in internal quantum efficiency and in esternal quantum efficiency. However, even those phosphors are still also wanted to be further improved in color purity.

BRIEF DESCRIPTION OF THE DRAWINGS

FIGS. 1 (A) to (C) illustrate a first $Sr_3Al_3Si_{13}O_2N_{21}$ crystal lattice structure. FIGS. 1(A), 1(B) and 1(C) are projections of the $Sr_3Al_3Si_{13}O_2N_{21}$ crystal structure along the a, b and c axes, respectively.

FIGS. 2 (A) to (C) illustrate a second $Sr_3Al_3Si_{13}O_2N_{21}$ crystal lattice structure. FIGS. 2(A), 2(B) and 2(C) are projections of the $Sr_3Al_3Si_{13}O_2N_{21}$ crystal structure along the a, b and c axes, respectively.

FIGS. 3 (A) to (C) illustrate a third $Sr_3Al_3Si_{13}O_2N_{21}$ crystal lattice structure.

FIGS. 4 (A) to (C) illustrate a forth $Sr_3Al_3Si_{13}O_2N_{21}$ crystal lattice structure. FIGS. 4(A), 4(B) and 4(C) are projections of the $Sr_3Al_3Si_{13}O_2N_{21}$ crystal structure along the a, b and c axes, respectively.

FIG. 8 is an XRD profile of the fluorescent material in Example 1.

FIG. 9 is an XRD profile of the fluorescent material in Example 2.

FIG. 10 is an XRD profile of the fluorescent material in Example 3.

FIG. 11 shows transmission spectra of the color filters used in Application Example 101 and Comparative Application Example 101.

DETAILED DESCRIPTION

Figure 3A:
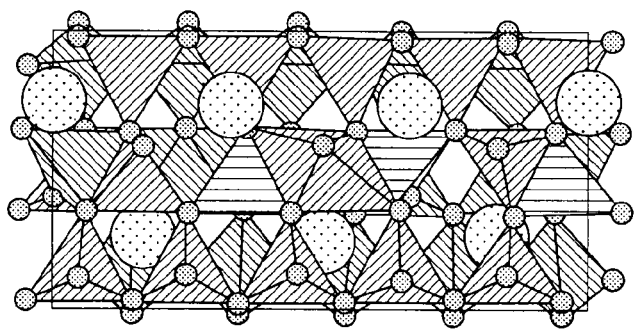
FIGS. 3(A), 3(B) and 3(C) are projections of the $Sr_3Al_3Si_{13}O_2N_{21}$ crystal structure along the a, b and c axes, respectively.
Figure 3B:
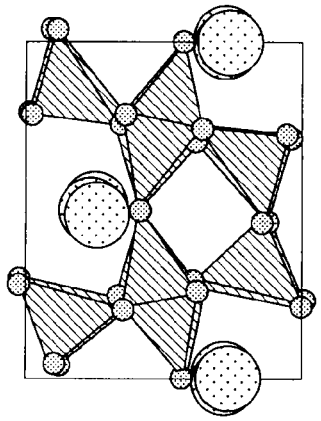
Figure 3C:
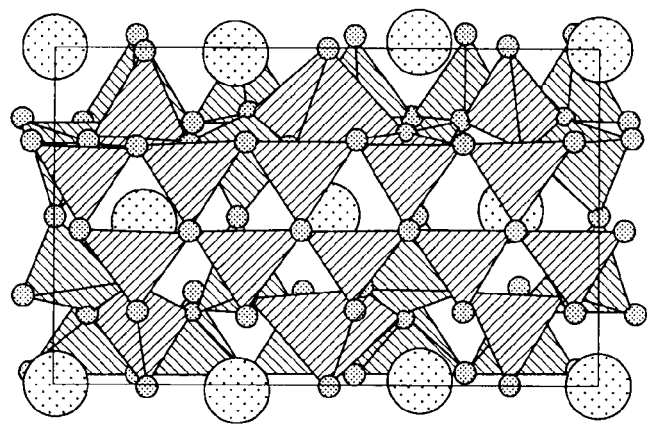

One of the embodiments resides in a process for production of an oxynitride fluorescent material represented by the following formula (1):

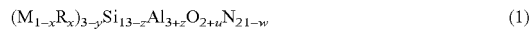
$$(M_{1-x}R_x)_{3-y}Si_{13-z}Al_{3+z}O_{2+u}N_{21-w} \tag{1}$$

in which M is an element selected from the IA group elements, the IIA group elements, the IIIA group elements other than Al, the IIIB group elements, the rare earth elements, and the IVA group elements other than Si; R is an element selected from the group consisting of Eu, Ce, Mn, Tb, Yb, Dy, Sm, Tm, Pr, Nd, Pm, Ho, Er, Cr, Sn, Cu, Zn, As, Ag, Cd, Sb, Au, Hg, Tl, Pb, Bi and Fe; and x, y, z, u and w are numbers satisfying the conditions of $0<x\leq 1$, $-0.1\leq y\leq 0.15$, $-1\leq z\leq 1$, and $-1<u-w\leq 1.5$, respectively;

including the steps of mixing a nitride or carbide of said element M; a halide of said element M; an oxide, nitride or carbonate of said element R; a nitride, oxide or carbide of Si; and a nitride, oxide or carbide of Al, to prepare a material mixture;

firing the material mixture; and then acid-washing the fired product.

Another of the embodiments resides in a process for production of an oxynitride fluorescent material represented by the following formula (2):

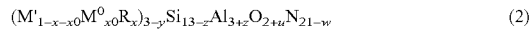
$$(M'_{1-x-x0}M^0{}_{x0}R_x)_{3-y}Si_{13-z}Al_{3+z}O_{2+u}N_{21-w} \tag{2}$$

in which M' is an element selected from the IA group elements other than Na, the IIA group elements other than Ca, the IIIA group elements other than Al, the IIIB group elements, the rare earth elements and the IVA group elements other than Si; $M^0$ is an element selected from the group consisting of Ca and Na; R is an element selected from the group consisting of Eu, Ce, Mn, Tb, Yb, Dy, Sm, Tm, Pr, Nd, Pm, Ho, Er, Cr, Sn, Cu, Zn, As, Ag, Cd, Sb, Au, Hg, Tl, Pb, Bi and Fe; and x, x0, y, z, u and w are numbers satisfying the conditions of $0<x\leq 1$, $0<x0\leq 0.08$, $-0.1\leq y\leq 0.15$, $-1\leq z\leq 1$, and $-1<u-w\leq 1.5$, respectively;

including the steps of mixing a nitride or carbide of said element M'; a halide of said element $M^0$; an oxide, nitride or carbonate of said element R; a nitride, oxide or carbide of Si; and a nitride, oxide or carbide of Al, to prepare a material mixture;

firing the material mixture; and then acid-washing the fired product.

Still another of the embodiments resides in an oxynitride fluorescent material represented by the following formula (2):

$$(M'_{1-x-x0}M^0_{x0}R_x)_{3-y}Si_{13-z}Al_{3+z}O_{2+u}N_{21-w} \quad (2)$$

in which M' is an element selected from the IA group elements other than Na, the IIA group elements other than Ca, the IIIA group elements other than Al, the IIIB group elements, the rare earth elements and the IVA group elements other than Si; $M^0$ is an element selected from the group consisting of Ca and Na; R is an element selected from the group consisting of Eu, Ce, Mn, Tb, Yb, Dy, Sm, Tm, Pr, Nd, Pm, Ho, Er, Cr, Sn, Cu, Zn, As, Ag, Cd, Sb, Au, Hg, Tl, Pb, Bi and Fe; and x, x0, y, z, u and w are numbers satisfying the conditions of $0<x \leq 1$, $0<x0 \leq 0.08$, $-0.1 \leq y \leq 0.15$, $-1 \leq z \leq 1$, and $-1<u-w \leq 1.5$, respectively; and emitting luminescence having a peak in the wavelength range of 490 to 580 nm when excited with light in the wavelength range of 250 to 500 nm.

Further, a light-emitting device according to the embodiment comprises a light-emitting element giving off light in the wavelength range of 250 to 500 nm, and a phosphor layer which is provided on said light-emitting element and which contains the oxynitride fluorescent material described above.

The embodiment provides a fluorescent material having excellent quantum efficiency and hence giving high emission intensity. Furthermore, the fluorescent material also has excellent chromaticity and high practicality. Especially, a half bandwidth of the emission spectrum emitted from the fluorescent material is narrow. Further, the coordinate point in the chromaticity diagram expressed by x-y coordinate system shift to the minus direction of x-axis, then the chromaticity is improved and the reproducible color gamut is broadened.

Embodiments will now be explained with reference to the accompanying drawings.

The oxynitride fluorescent material according to the embodiment is based on $Sr_3Al_3Si_{13}O_2N_{21}$ crystal structure, and the phosphor is modified by replacing its constituting elements with other elements and/or by fusing the luminescence center metal element to form a solid solution. The fluorescent material is generally produced by firing a mixture of compounds containing the constituting elements. The process for production of the fluorescent material according to the embodiment is characterized by adopting a halide as one of the material compounds containing elements corresponding to Sr in $Sr_3Al_3Si_{13}O_2N_{21}$ crystal.

The oxynitride fluorescent material of the embodiment can be represented by the following formula (1):

$$(M_{1-x}R_x)_{3-y}Si_{13-z}Al_{3+z}O_{2+u}N_{21-w} \quad (1)$$

in which M is an element selected from the IA group elements, the IIA group elements, the IIIA group elements other than Al, the IIIB group elements, the rare earth elements, and the IVA group elements other than Si; R is an element selected from the group consisting of Eu, Ce, Mn, Tb, Yb, Dy, Sm, Tm, Pr, Nd, Pm, Ho, Er, Cr, Sn, Cu, Zn, As, Ag, Cd, Sb, Au, Hg, Tl, Pb, Bi and Fe; and x, y, z, u and w are numbers satisfying the conditions of $0<x \leq 1$, $-0.1 \leq y \leq 0.15$, $-1 \leq z \leq 1$, and $-1<u-w \leq 1.5$, respectively.

The metal element M is preferably selected from the IA (alkali metal) group elements such as Li, Na and K; the IIA (alkaline earth metal) group elements such as Mg, Ca, Sr and Ba; the IIIA group elements such as B, Ga and In; the IIIB group elements such as Y and Sc; the rare earth elements such as Gd, La and Lu; and the IVA group elements such as Ge. The metal element M may be either a single element or a combination of two or more elements.

The element R is selected from the group consisting of Eu, Ce, Mn, Tb, Yb, Dy, Sm, Tm, Pr, Nd, Pm, Ho, Er, Cr, Sn, Cu, Zn, As, Ag, Cd, Sb, Au, Hg, Tl, Pb, Bi and Fe. The element R may be either a single element or a combination of two or more elements.

The fluorescent material according to the embodiment has a crystal structure basically containing the elements M, Si, Al and O and/or N, and it is necessary that the metal element M be partly replaced with the luminescence center element R.

The luminescence center element R can be freely selected from the above elements in view of emission wavelength, emission intensity and the like. However, because of advantage in emission wavelength variability and the like, either or both of Eu and Mn can be preferably used.

The luminescence center element R preferably replaces the element M, which corresponds to Sr in the basic $Sr_3Al_3Si_{13}O_2N_{21}$ crystal, in an amount of 0.1 mol % or more. If the amount of the replaced M is less than 0.1 mol %, it is difficult to obtain sufficient emission intensity. The metal element M can be completely replaced with the luminescence center element R. However, if the amount of the replaced M is less than 50 mol %, the decrease of emission probability (concentration quenching) can be prevented to the utmost. The luminescence center element enables the fluorescent material of the embodiment to emit light in the range of bluish green to yellowish green, namely, to give off luminescence having a peak in the wavelength range of 490 to 580 nm under the excitation with light of 250 to 500 nm.

In the oxynitride fluorescent material represented by the formula (1), the element M may be two or more elements in combination. Specifically, since the luminescence is improved in chromaticity, it is preferred that Sr in $Sr_3Al_3Si_{13}O_2N_{21}$ be partly replaced with a small amount of Ca or Na. The oxynitride fluorescent material according to that embodiment can be represented by the following formula (2):

$$(M'_{1-x-x0}M^0_{x0}R_x)_{3-y}Si_{13-z}Al_{3+z}O_{2+u}N_{21-w} \quad (2)$$

in which M' is an element selected from the IA group elements other than Na, the IIA group elements other than Ca, the IIIA group elements other than Al, the IIIB group elements, the rare earth elements, and the IVA group elements other than Si; $M^0$ is an element selected from the group consisting of Ca and Na; R is an element selected from the group consisting of Eu, Ce, Mn, Tb, Yb, Dy, Sm, Tm, Pr, Nd, Pm, Ho, Er, Cr, Sn, Cu, Zn, As, Ag, Cd, Sb, Au, Hg, Tl, Pb, Bi and Fe; and x, x0, y, z, u and w are numbers satisfying the conditions of $0<x \leq 1$, $0<x0 \leq 0.08$, $-0.1 \leq y \leq 0.15$, $-1 \leq z \leq 1$, and $-1<u-w \leq 1.5$, respectively.

The combination of the elements M' and $M^0$ in the formula (2) corresponds to the element M in the formula (1).

The fluorescent material according to the embodiment can be considered to be an oxynitride based on $Sr_3Al_3Si_{13}O_2N_{21}$, and its constituting elements Sr, Si, Al, O and N are replaced with other elements and/or other metal elements such as Eu. These modifications such as replacement change the lattice constants, and thereby the crystal structure is often slightly changed. However, the atomic positions therein, which depend on such conditions as the crystal structure, the sites occupied by the atoms therein and their atomic coordinates, are seldom changed so greatly that the chemical bonds among the skeleton atoms are broken. This means that the fluorescent material of the embodiment can give the effect of the embodiment without changing the fundamental crystal structure. Specifically, in the embodiment, the chemical bond lengths (close interatomic distances) of Sr—N and Sr—O calculated from the lattice constants and atomic coordinates determined by X-ray diffraction or neutron diffraction are preferably within the range of ±15% based on those of Sr—N and Sr—O of $Sr_3Si_{13}Al_3O_2N_{21}$ (shown in Table 1), respectively. If the chemical bond lengths are changed more than the above, they are broken to form another crystal structure and hence it may be difficult to fully obtain the effect of the embodiment.

TABLE 1

| | Bond lengths (Å) in $Sr_3Si_{13}Al_3O_2N_{21}$ |
|---|---|
| Sr1-O/N4 | 2.6650(9) |
| Sr1-O/N8 | 3.070(17) |
| Sr1-O/N10 | 2.783(15) |
| Sr1-O/N6 | 2.743(10) |
| Sr1-O/N9 | 2.929(18) |
| Sr2-O/N11 | 3.080(2) |
| Sr2-O/N14 | 3.001(17) |
| Sr2-O/N16 | 2.904(16) |
| Sr2-O/N20 | 2.762(11) |
| Sr2-O/N13 | 3.109(17) |
| Sr2-O/N15 | 2.772(17) |
| Sr2-O/N17 | 3.008(10) |

Figure 5:
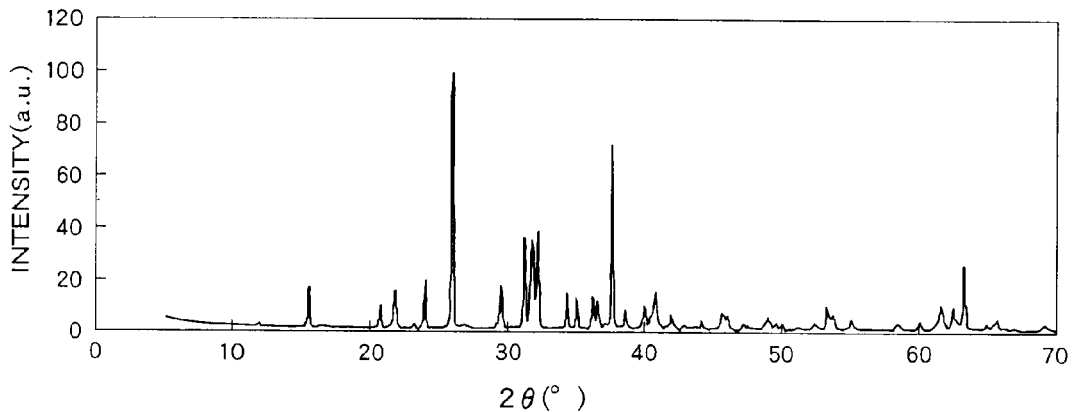
FIG. 5 is an XRD profile of a fluorescent material having the $Sr_3Al_3Si_{13}O_2N_{21}$ crystal structure.

The crystal structure of $Sr_3Al_3Si_{13}O_2N_{21}$ belongs to an orthorhombic system, and comprises four kinds of framework structure randomly stacked along the c-axis. Those four framework structures are individually illustrated in FIGS. 1 to 4. The average lattice constants of the crystal are a=9.037 (6) Å, b=14.734 (9) Å and c=29.856 (20) Å, and they correspond to sizes of the four framework structures stacked along the c-axis. FIG. 5 shows an XRD profile of the crystal.

The crystal structure of the fluorescent material according to the embodiment can be identified by X-ray diffraction or neutron diffraction. The embodiment includes not only a fluorescent material exhibiting the same XRD profile as $Sr_3Al_3Si_{13}O_2N_{21}$, but also a compound in which the constituting elements of $Sr_3Al_3Si_{13}O_2N_{21}$ are replaced with other elements so as to change the lattice constants in the particular ranges. For example, the fluorescent material of the embodiment includes a compound having the $Sr_3Al_3Si_{13}O_2N_{21}$ crystal structure in which Sr is replaced with the luminescence center element R and, if needed, with the element $M^o$. Further, Al and Si may be partly substituted with each other, and/or O and N may be partly substituted with each other. Examples of that compound include $Sr_3Al_2Si_{14}ON_{22}$, $Sr_3AlSi_{15}N_{23}$, $Sr_3Al_4Si_{12}O_3N_{20}$, $Sr_3Al_5Si_{11}O_4N_{19}$ and $Sr_3Al_6Si_{10}O_5N_{18}$. These compounds have crystal structures belonging to the same group as $Sr_3Al_3Si_{13}O_2N_{21}$.

In the case where replacement ratio is small, it can be judged whether or not the replaced crystal belongs to the same group as $Sr_3Al_3Si_{13}O_2N_{21}$ by the following simple method. The XRD profile of the modified crystal is measured, and the positions of the diffraction peaks are compared with those in the XRD profile of $Sr_3Al_3Si_{13}O_2N_{21}$. As a result, if the positions of the main peaks are identical, their crystal structures can be regarded as the same. As the main peaks for comparison, it is preferred to select about 10 peaks having strong diffraction intensity.

The oxynitride fluorescent material of the embodiment can be synthesized by the steps of firing a mixture of starting materials and then acid-washing the fired product. Examples of the starting materials include: nitrides of the element M or carbides thereof such as cyanamide; nitrides, oxides or carbides of Al and Si; and oxides, nitrides or carbonates of the luminescence center element R. In the process of the embodiment for production of the oxynitride fluorescent material, it is indispensable to adopt a halide of the element M or $M^o$ as one of the starting materials. In the step of firing the material mixture containing the halide, the halide is presumed to be liquefied so as to promote solid-phase reactions among the materials and thereby to accelerate the crystallization. After the firing step, excess of the halide and foreign substances are removed by acid-washing so as to obtain a fluorescent material of high purity. The properties of the fluorescent material are presumed to be thus improved.

Examples of the halide include $SrF_2$, $CaCl_2$ and NaF.

Specifically, in the case where Sr as the element M and Eu as the luminescence center element R are intended to be incorporated, it is possible to adopt $Sr_3N_2$, $SrF_2$, $Si_3N_4$, AlN, $Al_2O_3$ and EuN as the starting materials. It is also possible to use $Ca_3N_2$, $Ba_3N_2$, $Sr_2N$, SrN or mixtures thereof in place of $Sr_3N_2$. In the case where Sr is intended to be partly replaced with Ca, it is possible to adopt $Sr_3N_2$, $CaCl_2$, $Si_3N_4$, AlN, $Al_2O_3$ and EuN as the starting materials. There is no particular restriction on the combination of the materials, and any materials can be used in combination. Those materials are weighed and mixed so that the aimed composition can be obtained. The materials are mixed, for example, in a mortar in a glove box.

Subsequently, the mixture of the starting materials can be fired, for example, in a crucible for a predetermined time to prepare an oxynitride having the aimed composition. The crucible is made of, for example, boron nitride, silicon nitride, silicon carbide, carbon, aluminum nitride, SiAlON, aluminum oxide, molybdenum or tungsten. The firing is preferably carried out under a pressure more than the atmospheric pressure. In order to prevent the silicon nitride as one of the starting materials from decomposing at a high temperature, the pressure is preferably not less than 5 atmospheres. The firing temperature is preferably in the range of 1500 to 2000° C., more preferably in the range of 1800 to 2000° C. If the temperature is less than 1500° C., it is often difficult to obtain the aimed oxynitride. On the other hand, if the temperature is more than 2000° C., there is a fear that the materials or the product may be sublimated. Further, since the material AlN is liable to be oxidized, the firing is preferably carried out under $N_2$ atmosphere. In that case, $N_2/H_2$ mixed gas atmosphere is also usable.

The fired product in the form of powder is then subjected to after-treatment such as washing, if necessary, to obtain a fluorescent material of the embodiment. If washing treatment is carried out, acid-washing is particularly preferred but other types of washing such as washing with pure water may be carried out. After the acid-washing, post-anneal treatment may be performed under nitrogen or hydrogen atmosphere, if necessary.

The fluorescent material of the embodiment can be utilized in a white LED as well as a green LED. In order to obtain white emission, the above fluorescent material is used in combination with plural fluorescent materials emitting luminescence in other wavelength ranges. For example, two or more fluorescent materials emitting red, yellow (or green) and blue luminescence under the excitation with UV light can be employed in combination. Further, the fluorescent material of the embodiment can be combined with a fluorescent material emitting yellow light when excited with blue light and, if necessary, also combined with a fluorescent material emitting red light. When excited with blue light, the fluorescent materials thus combined can give white emission, which is a mixture of the luminescence and the excitation blue light.

Figure 6:
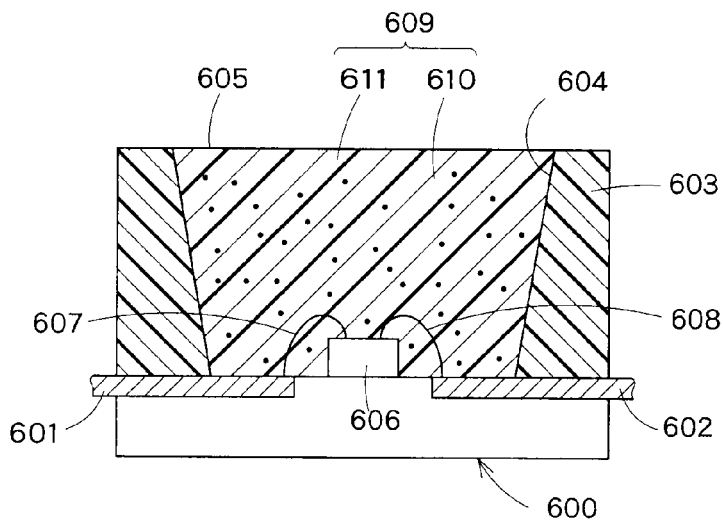
FIG. 6 is a cross-sectional view schematically illustrating a structure of a light-emitting device utilizing a fluorescent material according to an embodiment.

The fluorescent material according to the embodiment can be used in any conventionally known light-emitting device. FIG. 6 is a cross-sectional view schematically illustrating a package cup-type light-emitting device of the embodiment.

In the light-emitting device shown in FIG. 6, a resin stem 600 comprises leads 601 and 602 molded as parts of a lead frame and also a resin member 603 formed by unified molding together with the lead frame. The resin member 603 gives a concavity 605 in which the top opening is larger than the bottom. On the inside wall of the concavity, a reflective surface 604 is provided.

At the center of the nearly circular bottom of the concavity 605, a light-emitting chip 606 giving off light of 250 to 500 nm is mounted with Ag paste or the like. Examples of the light-emitting chip 606 include a light-emitting diode and a laser diode. The light-emitting chip may emit UV light. There is no particular restriction on the light-emitting chip. Accordingly, it is also possible to adopt a chip capable of emitting blue, bluish violet or near UV light as well as UV light. For example, a semiconductor light-emitting element such as GaN can be used as the light-emitting chip. The electrodes (not shown) of the light-emitting chip 606 are connected to the leads 601 and 602 by way of bonding wires 607 and 608 made of Au or the like, respectively. The positions of the leads 601 and 602 can be adequately modified.

In the concavity 605 of the resin member 603, a phosphor layer 609 is provided. For forming the phosphor layer 609, a fluorescent material 610 of the embodiment can be dispersed or precipitated in a resin layer 611 made of silicone resin or the like in an amount of 5 to 50 wt %. The fluorescent material of the embodiment comprises an oxynitride matrix having high covalency, and hence is generally so hydrophobic that it has good compatibility with the resin. Accordingly, scattering at the interface between the resin and the fluorescent material is prevented enough to improve the light-extraction efficiency.

The light-emitting chip 606 may be of a flip chip type in which n-type and p-type electrodes are placed on the same plane. This chip can avoid troubles concerning the wires, such as disconnection or dislocation of the wires and light-absorption by the wires. In that case, therefore, a semiconductor light-emitting device excellent both in reliability and in luminance can be obtained. Further, it is also possible to employ an n-type substrate in the light-emitting chip 606 so as to produce a light-emitting device constituted as described below. In that device, an n-type electrode is formed on the back surface of the n-type substrate while a p-type electrode is formed on the top surface of the semiconductor layer on the substrate. One of the n-type and p-type electrodes is mounted on one of the leads, and the other electrode is connected to the other lead by way of a wire. The size of the light-emitting chip 606 and the dimension and shape of the concavity 605 can be properly changed.

Figures 7A, 7B:
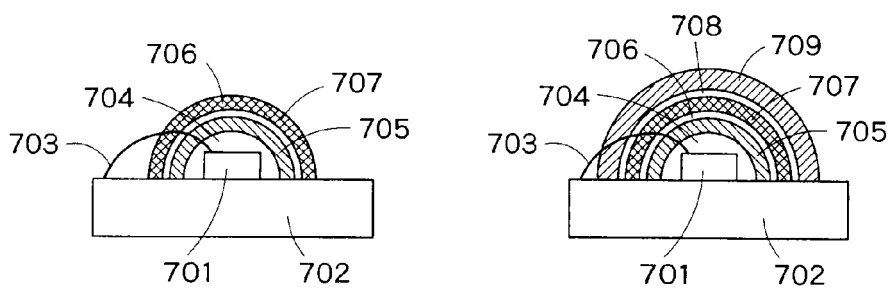
FIGS. 7 (A) and (B) are cross-sectional views schematically illustrating structures of other light-emitting devices utilizing a fluorescent material according to an embodiment.

FIGS. 7A and 7B illustrate schematic cross-sectional views of shell-type light-emitting devices of the embodiment.

In the light-emitting device shown in FIG. 7A, a light-emitting chip 701 giving an emission peak at, for example, 445 nm is soldered on a package 700 made of AlN and the like, and is connected to an electrode by way of an electroconductive wire 703. Further, the light-emitting chip 701 is domed with a transparent resin layer 704 made of silicone resin or the like, and thereon a transparent resin layer 705 containing a red light-emitting fluorescent material, a transparent resin layer 706 and a transparent resin layer 707 containing a green light-emitting fluorescent material of the embodiment are stacked in order. The device of FIG. 7A thus comprises the light-emitting chip and the red and green light-emitting fluorescent materials, each of which gives off luminescence when excited with excitation light emitted from the chip. The device can be further provided with a layer of blue light-emitting fluorescent material. FIG. 7B shows a schematic cross-sectional view of such device, which further comprises a transparent resin layer 708 and a layer 709 containing a blue light-emitting fluorescent material. Those layers are formed on the green fluorescent material layer 707 of the device shown in FIG. 7A. The light-emitting diode used in the device of FIG. 7B is generally designed to radiate light containing blue component in a less amount than that in the device of FIG. 7A. This is because the excitation light and the luminescence emitted from each fluorescent material are so designed that the light-emitting device can give off light of desired color, such as while light, in total.

The light-emitting device according to the embodiment is not restricted to the types shown in FIGS. 6 and 7, and can be freely applied to any type of devices. For example, even if the fluorescent material according to the embodiment is used in a surface-mount type light-emitting device, the same effect can be obtained.

LED lamps including the fluorescent material of the embodiment can be used in many displaying elements of instruments such as mobile devices, PC peripheral equipments, OA equipments, various kinds of switches, light sources for backlighting, and indicating boards. Since the fluorescent material of the embodiment is excellent in color purity, the light-emitting devices provided with phosphor layers containing that substance are excellent in color reproduction.

The embodiment is further explained by the following examples, which by no means restrict the embodiment.

Example 1

As the starting materials, $Sr_3N_2$, EuN, $Si_3N_4$, $Al_2O_3$, $CaCl_2$ and AlN in the amounts of 2.409 g, 0.647 g, 5.987 g, 0.748 g, 0.200 g and 0.710 g, respectively, were weighed and dry-mixed in an agate mortar in a vacuum glove box. The mixture was placed in a BN crucible and then fired at 1850° C. for 4 hours under 7.5 atm of $N_2$ atmosphere, to synthesize a fluorescent material. The obtained fluorescent material was analyzed to find that the composition thereof could be represented by $(Sr_{0.829}Ca_{0.039}Eu_{0.133})_{2.99}Si_{12.7}Al_{3.32}O_{2.9}N_{20.9}$, which corresponded to the formula (1) with y=0.01, z=0.32, u=0.9 and w=0.1.

The fluorescent material obtained by firing was in the form of yellowish green powder, and was observed to emit green luminescence when excited with black light. The fluorescent material was washed with aqua regia and then with pure water, and thereafter dried at 150° C. for 12 hours in a drying oven.

Example 2

The procedure of Example 1 was repeated except that 0.200 g of $CaCl_2$ was replaced with 0.200 g of NaF, to synthesize a fluorescent material. The obtained fluorescent material was analyzed to find that the composition thereof could be represented by $(Sr_{0.860}Na_{0.039}Eu_{0.140})_{2.88}Si_{12.7}Al_{3.32}O_{2.9}N_{20.8}$, which corresponded to the formula (2) with y=0.12, z=0.32, u=0.9 and w=0.2.

Example 3

The procedure of Example 1 was repeated except that 0.200 g of $CaCl_2$ was replaced with 0.200 g of $SrF_2$, to synthesize a fluorescent material. The obtained fluorescent material was analyzed to find that the composition thereof could be represented by $(Sr_{0.872}Eu_{0.128})_{2.94}Si_{12.8}Al_{3.24}O_{2.7}N_{21.4}$, which corresponded to the formula (1) with y=0.06, z=0.24, u=0.7 and w=−0.4.

Comparative Example 1

The procedure of Example 1 was repeated except that $CaCl_2$ was not contained in the starting materials, to synthesize a fluorescent material whose designed composition was $(Sr_{0.866}Eu_{0.134})_{2.9}Si_{12.8}Al_{3.2}O_{2.2}N_{20.8}$.

FIGS. 8 to 10 are XRD profiles of the green fluorescent materials synthesized in Examples 1 to 3, respectively. On the other hand, the fluorescent material of Comparative Example 1 gave an XRD profile not significantly different from that of the $Sr_3Al_3Si_{13}O_2N_{21}$ crystal shown in FIG. 5. Those results indicate that the XRD profiles of Examples 1 to 3 and Comparative Example 1 are not significantly different from each other, and hence it was found that the fluorescent materials of Examples 1 to 3 had crystal structures belonging to the same group as the $Sr_3Al_3Si_{13}O_2N_{21}$ crystal.

Each of the green fluorescent materials of Examples 1 to 3 and Comparative Example 1 was exposed to black light having a peak at the wavelength of 365 nm, so as to measure chromaticity (Cx, Cy) of the luminescence at a 2-degree visual field. The results were as set forth in Table 2. The Cy values of Examples 1 to 3 were 0.589 to 0.599, and hence were almost the same as that of Comparative Example 1. On the other hand, however, the Cx values of Examples 1 to 3 were 0.245 to 0.254, and hence were obviously lower than that of Comparative Example 1 (i.e., 0.276). This indicates that the fluorescent materials according to the embodiment were improved in color purity.

TABLE 2

|  | Cx | Cy |
|---|---|---|
| Ex. 1 | 0.245 | 0.599 |
| Ex. 2 | 0.246 | 0.589 |
| Ex. 3 | 0.254 | 0.596 |
| Com. Ex. 1 | 0.276 | 0.600 |

Application Example 101

A light-emitting device of Application Example 101 was produced by use of the fluorescent material synthesized in Example 1. The device had a structure according to FIG. 7A. Specifically, a light-emitting diode giving an emission peak at 445 nm was soldered on an 8 mm-square AlN package, and was connected to electrodes by way of gold wires. The diode was then domed with transparent resin, and the dome was coated with a layer of transparent resin containing 10 wt % of red fluorescent material $CaAlSiN_3:Eu^{2+}$ giving an emission peak at 665 nm. Further, another layer of transparent resin and still another layer of transparent resin containing 40 wt % of the fluorescent material of Example 1 were provided thereon, to produce a light-emitting device.

Comparative Application Example 101

The procedure of Application Example 101 was repeated except that the fluorescent material of Comparative Example 1 was used as the green fluorescent material, to produce a light-emitting device of Comparative Application Example 101.

With respect to each of the light-emitting devices of Application Example 101 and Comparative Application Example 101, emission was observed through color filters having the transmission spectra shown in FIG. 11 so as to determine the NTSC ratio. As a result, the NTSC ratios of Application Example 101 and Comparative Application Example 101 were found to be 101 and 100, respectively. Here "NTSC", named for the National Television System Committee, is the analog television system used in America. The "NTSC ratio" of a display means a ratio of how much color-area the display can reproduce, provided that the color-area capable of being reproduced by the NTCS system is regarded as 100%, based on 1976 UCS color diagram determined by CIE (Commission Internationale de l'Éclairage). The higher the NTSC ratio is, the more excellent in color reproduction the display is. The device of Application Example 101 exhibited a higher NTSC ratio than that of Comparative Application Example 101, and accordingly it was found that the device of Application Example 101 could provide better color reproduction.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and sprit of the invention.

The invention claimed is:

1. A process for production of an oxynitride fluorescent material represented by the following formula (1):

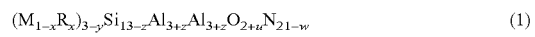

$$(M_{1-x}R_x)_{3-y}Si_{13-z}Al_{3+z}Al_{3+z}O_{2+u}N_{21-w} \quad (1)$$

in which M is an element selected from the IA group elements, the IIA group elements, the IIIA group elements other than Al, the IIIB group elements, the rare earth elements, and the IVA group elements other than Si; R is an element selected from the group consisting of Eu, Ce, Mn, Tb, Yb, Dy, Sm, Tm, Pr, Nd, Pm, Ho, Er, Cr, Sn, Cu, Zn, As, Ag, Cd, Sb, Au, Hg, Tl, Pb, Bi and Fe; and x, y, z, u and w are numbers satisfying the conditions of $0<x\leq 1$, $-0.1\leq y\leq 0.15$, $-1\leq z\leq 1$, and $-1\leq u-w\leq 1.5$, respectively;

comprising the steps of mixing a nitride or carbide of said element M; a halide of said element M; an oxide, nitride or carbonate of said element R; a nitride, oxide or carbide of Si; and a nitride, oxide or carbide of Al, to prepare a material mixture;

firing the material mixture; and then acid-washing the fired product.

2. The process according to claim 1, wherein M is selected from the group consisting of Li, Na, K, Mg, Ca, Sr, B, Ga, In, Y, Sc, Gd, La, Lu and Ge.

3. The process according to claim 1, wherein said nitride of M is selected from the group consisting of $Sr_3N_2$, $Ca_3N_2$, $Ba_3N_2$, $Sr_2N$ and SrN.

4. The process according to claim 1, wherein said nitride of R is EuN.

5. The process according to claim 1, wherein the halide of said element M is $SrF_2$.

6. A process for production of an oxynitride fluorescent material represented by the following formula (2):

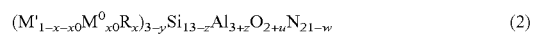

$$(M'_{1-x-x0}M^0_{x0}R_x)_{3-y}Si_{13-z}Al_{3+z}O_{2+u}N_{21-w} \quad (2)$$

in which M' is an element selected from the IA group elements other than Na, the IIA group elements other than Ca, the IIIA group elements other than Al, the IIIB group elements, the rare earth elements, and the IVA group elements other than Si; $M^o$ is an element selected from the group consisting of Ca and Na; R is an element selected from the group consisting of Eu, Ce, Mn, Tb, Yb, Dy, Sm, Tm, Pr, Nd, Pm, Ho, Er, Cr, Sn, Cu, Zn, As, Ag, Cd, Sb, Au, Hg, Tl, Pb, Bi and Fe; and x, x0, y, z, u and w are numbers satisfying the conditions of $0<x\leqq1$, $0<x0<0.08$, $-0.1\leqq y\leqq 0.15$, $-1\leqq z\leqq 1$, and $-1<u-w\leqq 1.5$, respectively;

comprising the steps of mixing a nitride or carbide of said element M'; a halide of said element $M^o$; an oxide, nitride or carbonate of said element R; a nitride, oxide or carbide of Si; and a nitride, oxide or carbide of Al, to prepare a material mixture;

firing the material mixture; and then acid-washing the fired product.

7. The process according to claim 6, wherein M is selected from the group consisting of Li, K, Mg, Sr, B, Ga, In, Y, Sc, Gd, La, Lu and Ge.

8. The process according to claim 6, wherein said nitride of M is selected from the group consisting of $Sr_3N_2$, $Ca_3N_2$, $Ba_3N_2$, $Sr_2N$ and SrN.

9. The process according to claim 6, wherein said nitride of R is EuN.

10. The process according to claim 6, wherein the halide of said element $M^o$ is $CaCl_2$ or NaF.

11. The process according to claim 1, wherein the firing is carried out under a pressure of more than atmospheric pressure.

12. The process according to claim 1, wherein the firing is carried out at a temperature of from 1500 to 2000° C.

13. The process according to claim 6, wherein the firing is carried out under a pressure of more than atmospheric pressure.

14. The process according to claim 6, wherein the firing is carried out at a temperature of from 1500 to 2000° C.

* * * * *